United States Patent [19]
Ledin et al.

[11] Patent Number: 6,002,594
[45] Date of Patent: Dec. 14, 1999

[54] FLEXIBLE TOUCHPAD CIRCUIT WITH MOUNTED CIRCUIT BOARD

[75] Inventors: Marc Ledin, Menlo Park; Bernard Kasser, Redwood City; Stephen J. Bisset, Palo Alto, all of Calif.

[73] Assignee: Logitech, Inc., Fremont, Calif.

[21] Appl. No.: 08/999,908

[22] Filed: Dec. 19, 1997

Related U.S. Application Data

[60] Provisional application No. 60/033,779, Dec. 20, 1996.

[51] Int. Cl.$^6$ ................................ H05K 1/11; H05K 9/09
[52] U.S. Cl. ....................... 361/803; 361/781; 361/790; 178/18
[58] Field of Search ....................... 178/17 A, 17 B, 178/17 C, 18, 19, 20, 110; 200/512, 513, 515, 520; 361/749, 784, 781, 789, 790, 803

[56] References Cited

U.S. PATENT DOCUMENTS

| | | | |
|---|---|---|---|
| 4,831,359 | 5/1989 | Newell | 341/5 |
| 5,506,375 | 4/1996 | Kikuchi | 178/18 |
| 5,521,336 | 5/1996 | Buchanan et al. | 178/18 |
| 5,543,589 | 8/1996 | Buchanan et al. | 178/18 |
| 5,565,658 | 10/1996 | Gerpheide et al. | 178/19 |

FOREIGN PATENT DOCUMENTS

WO 98/30967  7/1998  WIPO.

*Primary Examiner*—Donald Sparks
*Attorney, Agent, or Firm*—Townsend and Townsend and Crew LLP

[57] ABSTRACT

An improved flexible substrate for a touchpad, with the flexible substrate having conductive ink for forming a sensor array. A printed circuit board is also used, but only for the components which need to connect to the array, and not the array, thus giving a smaller printed circuit board. The printed circuit board can have the components compactly mounted on it taking advantage of the close spacing available in PC board technology. The PC board itself has wider spacing on its contacts at its outer edges, allowing it to be attached by conductive glue to the flexible substrate.

5 Claims, 4 Drawing Sheets

Components directly on polyester

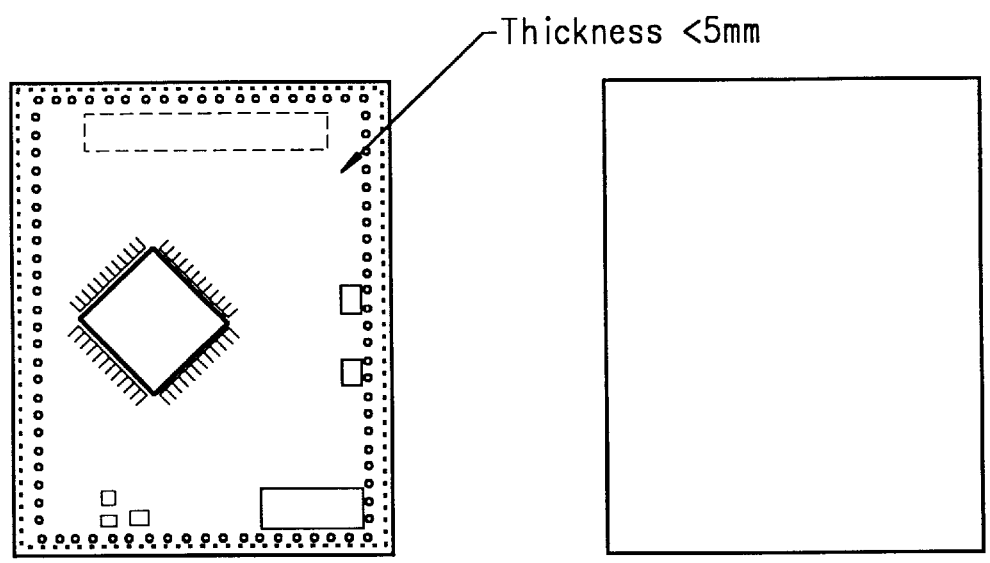
Conventional 4 layer PCB touchpad
*FIG. 4A*   *FIG. 4B*

FLEXIBLE TOUCHPAD CIRCUIT WITH MOUNTED CIRCUIT BOARD

This application claims benefit of provisional application Ser. No. 06/033,779 filed Dec. 20, 1996.

BACKGROUND OF THE INVENTION

The present invention relates to touchpads, and in particular to methods for assembling lightweight, very thin, low cost touchpads.

A touchpad is one method for providing a pointing function to control a cursor or viewpoint on a computer. Alternately, the display itself can be a touchscreen, being activated when the user presses on the screen. Detection of the user finger or stylus has been done by a variety of different ways. Resistive tablets are one method that has been used, such as disclosed in U.S. Pat. No. 4,680,430. Another method uses surface acoustic waves. Yet another method uses strain gauges or pressure plates. Optical devices have also been used.

The most common type of commercially used touchpad device is a capacitive sensing device. One advantage of the capacitive-type device is the lower power consumption required and it doesn't require finger pressure. An example of such a device, which also discusses a number of other related technologies, is set forth in U.S. Pat. No. 5,495,077.

Touchpads are currently built into some laptop computers, typically being on a portion of a computer in front of the keyboard where the user would normally rest his or her hands. For a portable computer application, it is important that the touchpad unit consume little power, be compact, and be lightweight.

Typically, a touchpad requires a substrate with multiple layers. The layers include rows of conductive traces, followed by an insulating layer, followed by columns of conductive traces, followed by another insulating layer and a ground plane. By pressing on a particular portion of the array, the capacitance between the conductive lines and ground varies and can be detected. By sensing both rows and columns, the position of the changing capacitance can be pinpointed. A variety of electronic components are required in order to control and detect the signals from the sensor array.

One technology used in some electronics applications is a flexible, Mylar sheet upon which are deposited conductive ink. Such a sheet is thinner than a typical PC board, and thus provides size advantages. However, components cannot be soldered to a Mylar sheet without melting it, and thus conductive adhesives are required to attach components. Thus, electronic chips and discrete components can be attached to such a Mylar sheet.

One limitation in using a conductive glue or adhesive to attach components to the conductive ink traces on a Mylar sheet is that there must be sufficient spacing between the contacts or pads attaching to the sheet. Thus, greater spacing between leads of components, such as semiconductor chips, is required than would be required on a PC board. Thus, a tradeoff of using a Mylar sheet is that lower weight and a thinner profile can be obtained, but at the expense of requiring a greater area on which to place the components. One solution for semiconductor chips is to mount them in a larger package, with the package itself having a wider lead spacing which can then be attached to the Mylar sheet.

An approach used by Alps is to use a combination flexible sheet and circuit board at different layers for a touchpad device. Conventional touchpads use 4 layer PC boards. Instead of building all 4 layers of a touchpad from PC board material, a 2 layer PC board is used for the Alps touchpad. The flexible material is used for the upper 2 layers, and is glued to the PC board. This still gives a PC board which is the same size and is rigid, it does not provide a thin touchpad. Through holes are used to connect to the underlying PC layer, with conductive ink being placed on the flexible layer and over the through holes.

SUMMARY OF THE INVENTION

The present invention provides an improved flexible substrate for a touchpad, with the flexible substrate having conductive ink for forming a sensor array. A printed circuit board is also used, but only for the components which need to connect to the array, and not the array, thus giving a smaller printed circuit board. The printed circuit board can have the components compactly mounted on it taking advantage of the close spacing available in PC board technology. The PC board itself has wider spacing on its contacts at its outer edges, allowing it to be attached by conductive glue to the flexible substrate.

For a further understanding of the nature and advantages of the invention, reference should be made to the following description taken in conjunction with the accompanying drawings.

BRIEF DESCRIPTION OF THE DRAWINGS

FIGS. 4A-B are top and bottom views of a conventional 4 layer PCB touchpad.

DESCRIPTION OF THE PREFERRED EMBODIMENT

Figure 1:
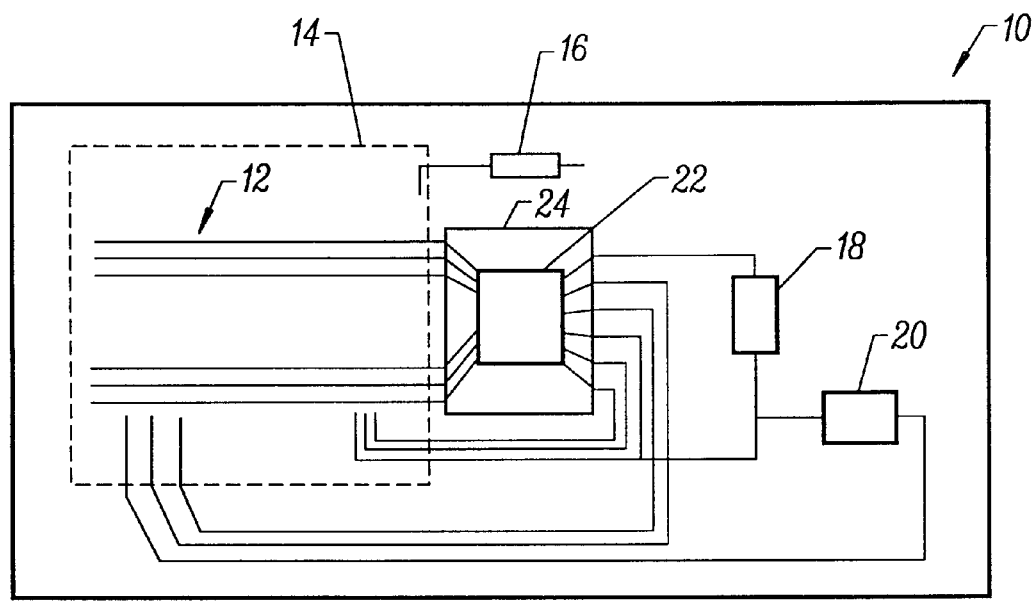
FIG. 1 is a diagram of a touchpad sensor with a flexible sheet and discrete components attached.

FIG. 1 shows a touchpad sensor substrate 10 made of a flexible material, such as Mylar. A number of traces 12 forming rows and columns of conductive ink form the touchpad array 14. The array can then be connected to a number of discrete components 16, 18 and 20, as well as a semiconductor integrated circuit package 22 (only some components are shown for illustration). Because of the spacing required to attach components using conductive adhesive to the flexible substrate 10, semiconductor chip package 22 could not be directly attached. One alternative is to mount the semiconductor chip of package 22 in a special package 24, having a wider perimeter and thus allowing more widely spaced leads or contacts to be attached to the substrate 10. As can be seen, the amount of room required for package 24, along with discrete components 16, 18 and 12, magnifies the size of the device.

Figure 2:
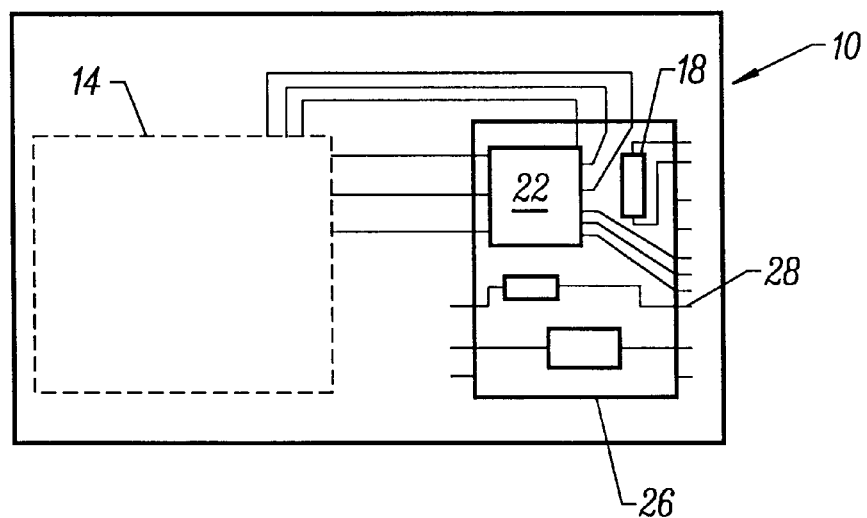
FIG. 2 is a diagram of a flexible sensor with a circuit board attached according to the invention.
Figure 3A:
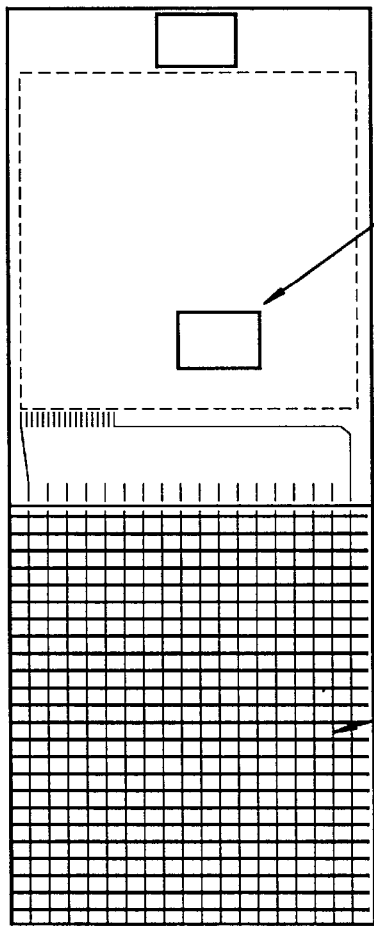
FIGS. 3A-B are top and bottom views of a prior art touchpad with components mounted directly on a polyester substrate.
Figure 3B:
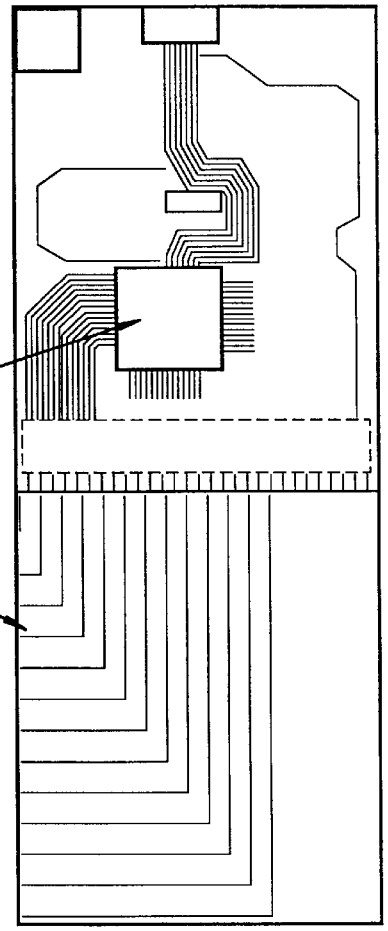
Figures 5A, 5B:
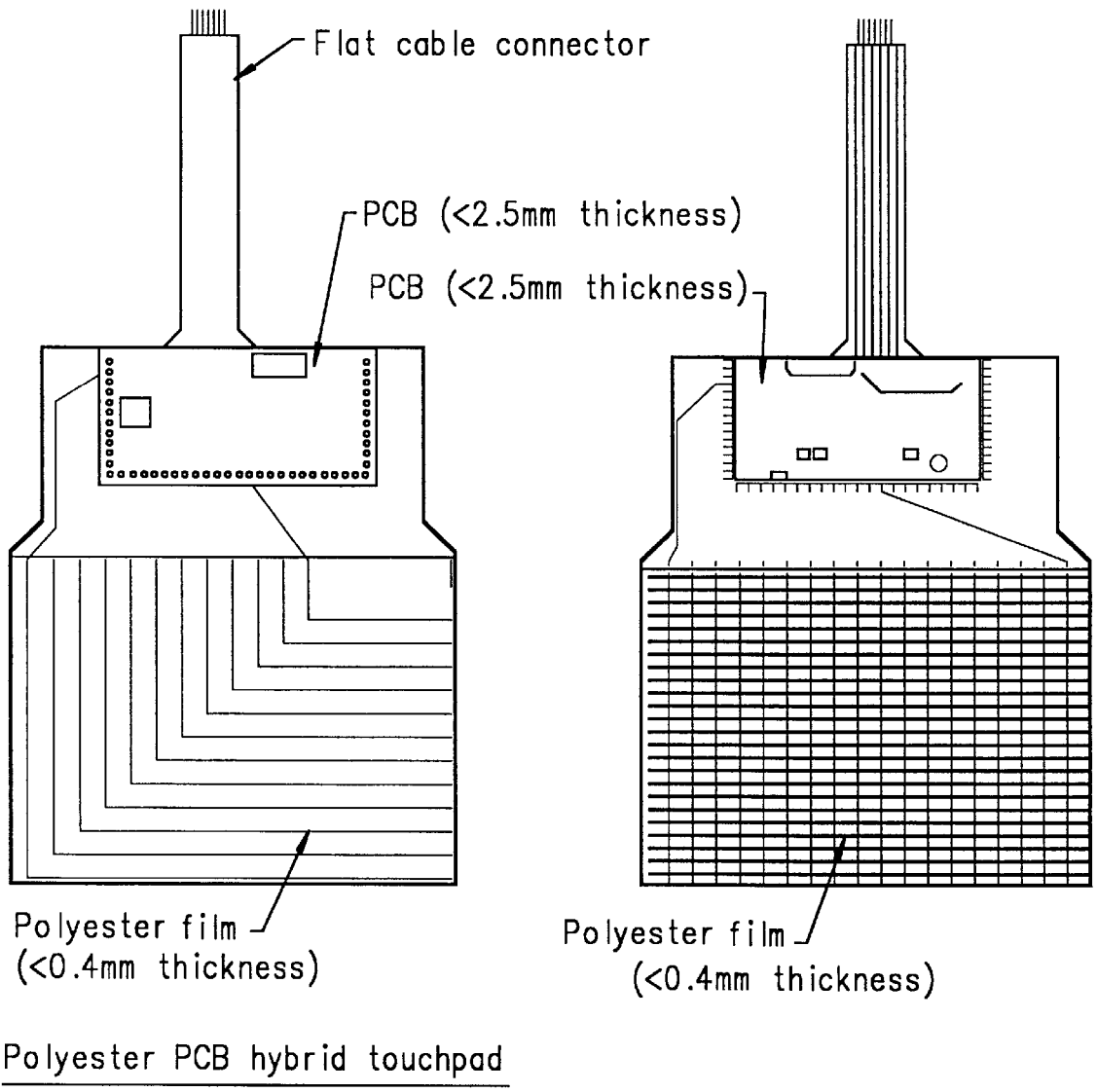
FIGS. 5A-B are top and bottom views of an embodiment of the present invention.

FIG. 2 illustrates a preferred embodiment of the present invention. The sensor array 14 is again formed of conductive ink traces on a substrate 10, preferably a polyester sheet such as Mylar. Here, however, semiconductor chip 22, along with components 16, 18 and 20 are all mounted on a conventional circuit board 26.

The use of circuit board 26 allows the components to be mounted tightly together, with the narrow lead or contact spacing permissible in printed circuit board technology. At the same time, the circuit board itself has wider spaced contacts 28 around its perimeter, with these contacts being sufficiently widely spaced to allow them to be attached by conductive adhesive to the conductive ink traces on substrate 10. By combining all the discrete components and any integrated circuit chips on a single PC board, which is then attached to the Mylar sheet upon which the sensor array is located, the present invention provides an elegant solution which is a marriage of two technologies to provide a low cost, compact circuit for a touchpad. Instead of using the prior art printed circuit board approach with all the components and a sensor array on the circuit board, or a Mylar flexible sheet approach, with discrete components mounted and wider spacing, the present invention uniquely marries the two technologies to extract the best from each and provide a combined structure which is easily manufactured at a low cost.

The present invention also allows mounting of different component types that cannot be mounted on a flexible sheet, or would be more difficult to mount on a flexible sheet. For example, COB ("Chip On Board") technology could be used (gluing the chip directly on the circuit board), or flip-chip technology, or simply chip packages with a fine pitch between leads. In general, more advanced component technology can be used on the PC board.

In addition, the present invention allows a ground plane to be added to the back of the circuit board to reduce noise problems. Such a ground plan on the flexible sheet would be problematic because of the thinness of the flexible sheet, causing undesirable capacitance which would affect the capacitive measurements of the touch pad array.

The present invention provides modularity by allowing the same PC board to be mounted on different flexible substrates. The flexible substrate can be customized to the particular size, array spacing, etc. for a particular customer.

The structure of the present invention also can provide modularity, by allowing different printed circuit boards 26 to be placed upon the same footprint of a substrate 10 to provide different functionality. This modularity also simplifies the manufacturing process by only requiring a single component to be attached to the Mylar sheet. The simpler, more proven technique of mounting multiple components on a printed circuit board can be done first, with all the components being mounted in a standard manner on the PC board, and then board itself mounted in one step to the Mylar sheet, simplifying the complex task of using conductive adhesive to mount a component to the Mylar sheet.

As will be apparent to those of skill in the art, the present invention could be embodied in other specific forms without departing from the spirit or essential characteristics thereof. Accordingly, the foregoing description is intended to be illustrative, but not limiting, of the scope of the invention, which is set forth in the following claims.

What is claimed is:

1. A touchpad for providing an input to a computer display, comprising:

an array of touchpad traces formed with conductive ink on a flexible substrate;

a plurality of connecting conductive traces for connecting said array of traces to other components;

a circuit board having contacts bonded to said connecting conductive traces, said contacts being bonded using a conductive adhesive, said contacts being sufficiently spaced to allow conductive adhesive to bond said contacts to said connecting conductive traces without contacting an adjacent trace;

a plurality of components mounted on said circuit board and connected to lines on said circuit board which are connected to said contacts, at least a plurality of said lines being connected to at least one of said components with a spacing closer than a spacing of said contacts.

2. The touchpad of claim 1 further comprising:

a ground plane deposited on a surface of said circuit board opposite said components.

3. The touchpad of claim 1 wherein said flexible substrate is polyester.

4. The touchpad of claim 1 wherein said components are mounted with a spacing closer than a spacing which would be possible if said components were mounted directly on said flexible substrate.

5. A touchpad for providing an input to a computer display, comprising:

an array of touchpad traces formed with conductive ink on a flexible substrate;

a plurality of connecting conductive traces for connecting said array of traces to other components;

a circuit board having contacts bonded to said connecting conductive traces, said contacts being bonded using a conductive adhesive, said contacts being sufficiently spaced to allow conductive adhesive to bond said contacts to said connecting conductive traces without contacting an adjacent trace;

a plurality of components mounted on said circuit board and connected to lines on said circuit board which are connected to said contacts, at least a plurality of said lines being connected to at least one of said components with a spacing closer than a spacing of said contacts; and a ground plane deposited on a surface of said circuit board opposite said components;

wherein said components are mounted with a spacing closer than a spacing which would be possible if said components were mounted directly on said flexible substrate.

* * * * *